(12) United States Patent
Young et al.

(10) Patent No.: US 10,720,338 B1
(45) Date of Patent: Jul. 21, 2020

(54) LOW TEMPERATURE COFIRED CERAMIC SUBSTRATES AND FABRICATION TECHNIQUES FOR THE SAME

(71) Applicant: HONEYWELL FEDERAL MANUFACTURING & TECHNOLOGIES, LLC, Kansas City, MO (US)

(72) Inventors: Barbara Young, Kansas City, MO (US); Randy Hamm, Kansas City, MO (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 0 days.

(21) Appl. No.: 15/805,352

(22) Filed: Nov. 7, 2017

(51) Int. Cl.
| | | |
|---|---|---|
| *H05K 1/02* | (2006.01) | |
| *H01L 21/48* | (2006.01) | |
| *H01L 23/498* | (2006.01) | |
| *H01L 23/00* | (2006.01) | |

(52) U.S. Cl.
CPC .... *H01L 21/4857* (2013.01); *H01L 23/49811* (2013.01); *H01L 23/49894* (2013.01); *H01L 24/48* (2013.01); *H01L 2224/48227* (2013.01)

(58) Field of Classification Search
CPC ........................ H05K 1/029803; H05K 1/0306
See application file for complete search history.

(56) References Cited

U.S. PATENT DOCUMENTS

| | | |
|---|---|---|
| 5,956,283 A | 9/1999 | Park |
| 6,607,934 B2 | 8/2003 | Chang et al. |
| 6,640,432 B1 | 11/2003 | Mathieu et al. |
| 6,917,086 B2 | 7/2005 | Cunningham et al. |
| 6,985,663 B2 | 1/2006 | Catchmark et al. |
| 7,012,327 B2 | 3/2006 | Huff et al. |
| 7,413,846 B2 | 8/2008 | Maloney et al. |
| 7,859,350 B1 | 12/2010 | Schwindt et al. |
| 7,897,503 B2 | 3/2011 | Foster et al. |
| 2006/0202322 A1* | 9/2006 | Kariya ............. H01L 23/49827 257/698 |
| 2009/0175017 A1* | 7/2009 | Kita ..................... H01L 21/481 361/792 |

(Continued)

OTHER PUBLICATIONS

Emesh et al. Plasma-Enhanced Chemical Vapor Deposition of Silicon Dioxide Using Tetraethylorthosilicate (TEOS), Journal of the Electrochemical Society, 1989, 3404-3408, 136-11.

*Primary Examiner* — Hoa C Nguyen
(74) *Attorney, Agent, or Firm* — Hovey Williams LLP

(57) ABSTRACT

A low temperature cofired ceramic substrate comprises a plurality of dielectric layers, at least one inner conductor layer, a plurality of bond pads, and a solder mask. The dielectric layers are formed from ceramic material and placed one on top of another to form a stack. The inner conductor is formed from electrically conductive paste and positioned on an upper surface of at least one inner dielectric layer. The bond pads are positioned on an outer surface of the stack. Each bond pad is formed from a plurality of conductive sublayers of thin film metal stacked one on top of another, with each conductive sublayer being formed from a different metal. The solder mask is positioned on the same outer surface of the stack as the bond pads and includes a plurality of openings, with each opening exposing at least a portion of one of the bond pads.

5 Claims, 2 Drawing Sheets

(56) References Cited

U.S. PATENT DOCUMENTS

| | | | |
|---|---|---|---|
| 2010/0224394 A1* | 9/2010 | Brunner | H01L 21/4867 |
| | | | 174/256 |
| 2010/0300733 A1* | 12/2010 | Kim | C04B 37/006 |
| | | | 174/257 |
| 2015/0216034 A1* | 7/2015 | Kitajima | H05K 1/0224 |
| | | | 174/251 |
| 2016/0157341 A1* | 6/2016 | Lee | H01L 23/49822 |
| | | | 174/251 |
| 2017/0019990 A1* | 1/2017 | Takemura | G01R 1/07378 |

* cited by examiner

LOW TEMPERATURE COFIRED CERAMIC SUBSTRATES AND FABRICATION TECHNIQUES FOR THE SAME

STATEMENT REGARDING FEDERALLY-SPONSORED RESEARCH OR DEVELOPMENT

This invention was made with government support under Contract No.: DE-NA0000622 awarded by the Department of Energy. The government has certain rights in the invention.

BACKGROUND OF THE INVENTION

Field of the Invention

Embodiments of the current invention relate to low temperature cofired ceramic substrates and fabrication techniques for the same.

Description of the Related Art

Electronic modules may be formed from integrated circuit (IC) dies and other electronic devices or components attached to low temperature cofired ceramic (LTCC) substrates. The IC dies or electronic devices may perform functions such as processing or sensing. The LTCC substrates may provide electrical interconnects, passive electronic components, and packaging for the IC dies and electronic devices. A typical LTCC substrate may comprise a plurality of layers, or sheets, of a ceramic dielectric with each layer including electrically conductive material, such as thick-film gold or silver paste, forming electrical interconnects, passive components, and layer-to-layer vias. The layers may be stacked one on another and fired at a temperature ranging from 800 degrees Celsius to 1000 degrees Celsius to form the substrate. The LTCC substrate may include a plurality of electrically conductive pads on an upper and/or lower surface of the substrate to which the dies or other components are wire bonded, solder bonded, or flip-chip bonded. The upper and/or lower surface may also have deposited thereon a solder mask layer which includes openings that align with the pads. The solder mask allows solder to flow where it is needed on the pads and prevents solder from flowing where it is not needed.

It has been found that, while the electrically conductive pastes perform well for inner layers of the LTCC substrate, they may have drawbacks, such as susceptibility to the formation of oxides or lacking good solderability, when they are used to form the bond pads on the upper and/or lower surfaces of the substrate. In order to provide improved performance, a thin-film metal stack comprising a plurality of metal layers may be deposited on the upper surface and/or the lower surface of the LTCC substrate instead of the paste. The metal stack may be patterned and etched to form the interconnects and pads. A glass dielectric may be used to form the solder mask, which needs to be fired as well. However, the high temperature required for firing of the glass dielectric may cause reflow and/or diffusion of the metal layers of the thin-film metal stack used to form the bond pads, leading to problems with soldering or bonding and possibly diminished performance of the electronic module. Alternatively, other printed dielectric materials, such as organic dielectrics, may be used for the solder mask. Unfortunately, these materials do not provide sufficient masking and solder may wick or creep under the mask.

SUMMARY OF THE INVENTION

Embodiments of the current invention solve the above-mentioned problems and provide a distinct advance in the art of LTCC substrate fabrication. Specifically, the current invention provides an LTCC substrate that includes bond pads formed from a thin film metal stack and a solder mask which is silicon based and prevents solder wicking.

In one embodiment, the LTCC substrate comprises a plurality of dielectric layers, at least one inner conductor layer, a plurality of bond pads, and a solder mask. The dielectric layers are formed from ceramic material and placed one on top of another to form a stack. The inner conductor is formed from electrically conductive paste and positioned on an upper surface of at least one inner dielectric layer. The bond pads are positioned on an outer surface of the stack. Each bond pad is formed from a plurality of conductive sublayers of thin film metal stacked one on top of another, with each conductive sublayer being formed from a different metal. The solder mask is positioned on the same outer surface of the stack as the bond pads and includes a plurality of openings, with each opening exposing at least a portion of one of the bond pads.

In another embodiment, the current invention provides a method of fabricating an LTCC substrate. The method may comprise firing a plurality of dielectric layers and at least one inner conductor layer, the dielectric layers and the at least one inner conductor layer forming a stack; forming a plurality of bond pads on an outer surface of the stack, each bond pad including a plurality of thin film metal conductive sublayers stacked one on top of another; depositing a solder mask on the same outer surface of the stack as the bond pads; and removing at least a portion of the solder mask to form a plurality of openings, each opening exposing at least a portion of one of the bond pads.

Yet another embodiment of the current invention provides a method of fabricating an LTCC substrate. The method may comprise firing a plurality of dielectric layers and at least one inner conductor layer, the dielectric layers and the at least one inner conductor layer forming a stack; depositing a plurality of thin film metal conductive sublayers one on top of another on an outer surface of the stack, each conductive sublayer formed from a different metal; removing at least a portion of each of the conductive sublayers to form a plurality of bond pads; using plasma enhanced chemical vapor deposition to deposit a silicon dioxide solder mask on the same outer surface of the stack as the bond pads; and removing at least a portion of the solder mask to form a plurality of openings, each opening exposing at least a portion of one of the bond pads.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the current invention will be apparent from the following detailed description of the embodiments and the accompanying drawing figures.

BRIEF DESCRIPTION OF THE DRAWING FIGURES

Embodiments of the current invention are described in detail below with reference to the attached drawing figures, wherein.

Figure 4:
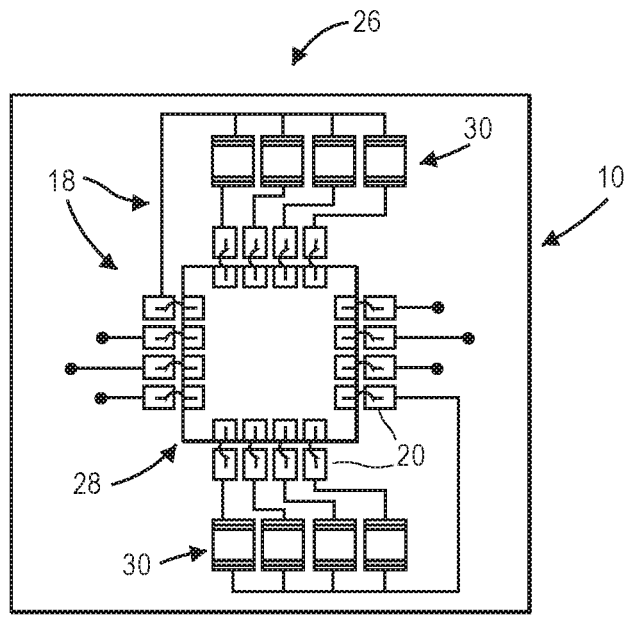
Figure 5:
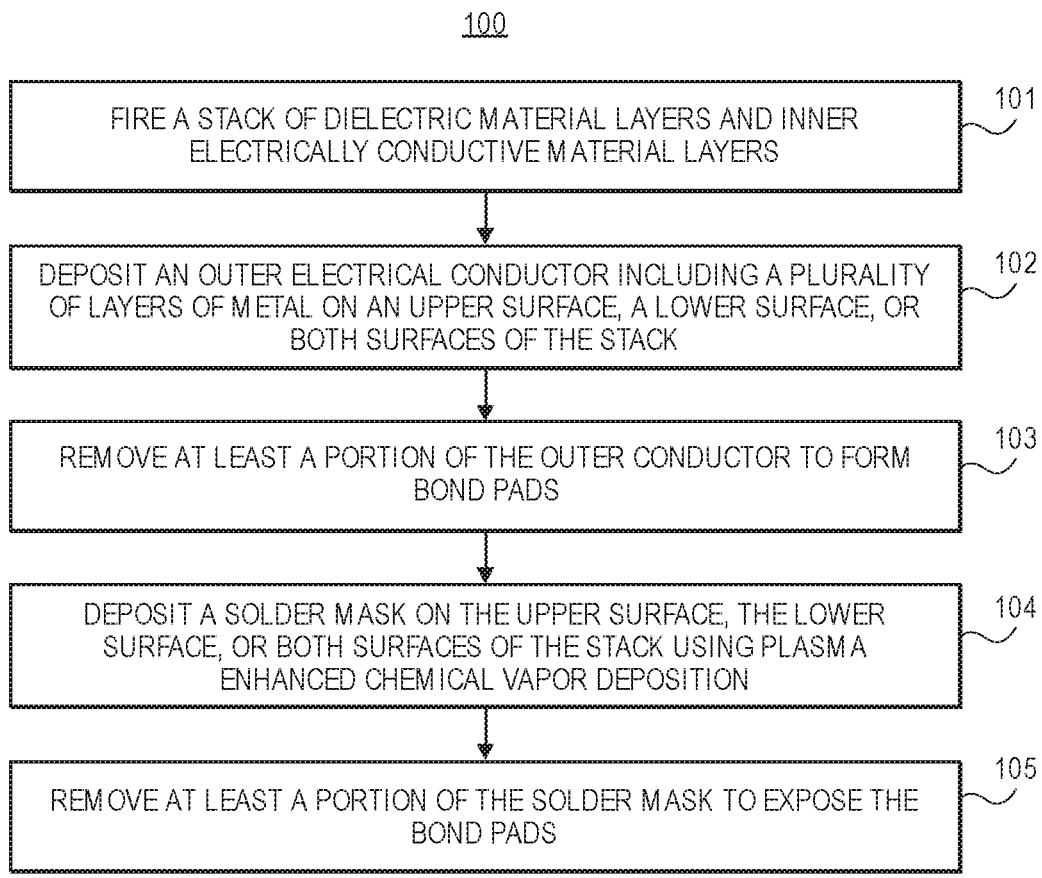

FIG. 4 is a top view of an electronic module comprising the LTCC substrate and one or more integrated circuit (IC) dies or one or more electronic devices or components, wherein the IC dies may be wire bonded to the LTCC substrate and the electronic devices may be solder bonded to the LTCC substrate; and FIG. 5 is a listing of at least a portion of the steps for a method of fabricating an LTCC substrate.

The drawing figures do not limit the current invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current technology can include a variety of combinations and/or integrations of the embodiments described herein.

Figure 1:
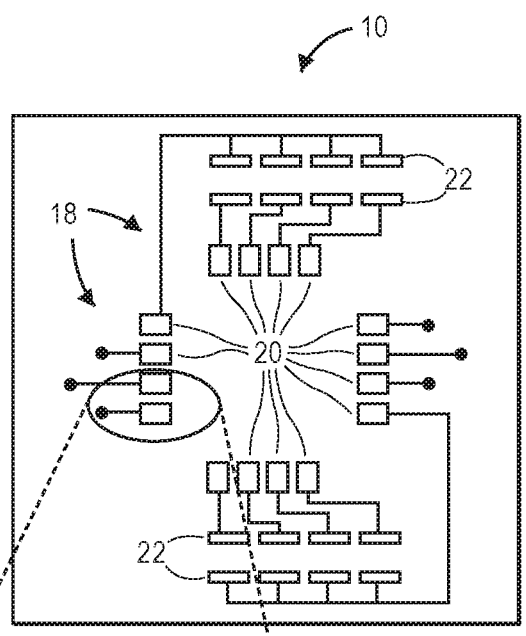
FIG. 1 is a top view of a low temperature cofired ceramic (LTCC) substrate, constructed in accordance with various embodiments of the current invention, the LTCC substrate comprising a plurality of wire bond pads and solder bond pads.
Figure 2:
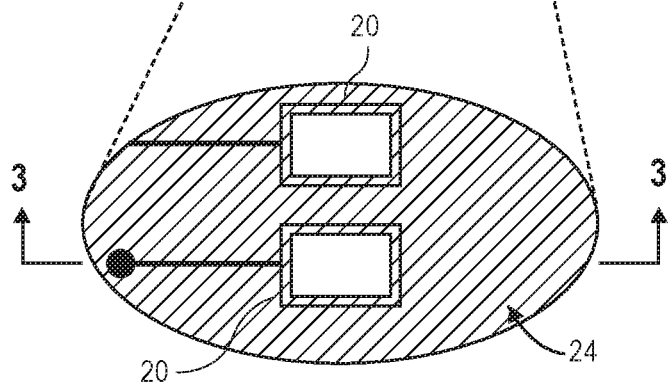
FIG. 2 is an enlarged view of an upper surface of the LTCC substrate in the vicinity of some wire bond pads, illustrating a solder mask covering the upper surface which includes openings over the wire bond pads.
Figure 3:
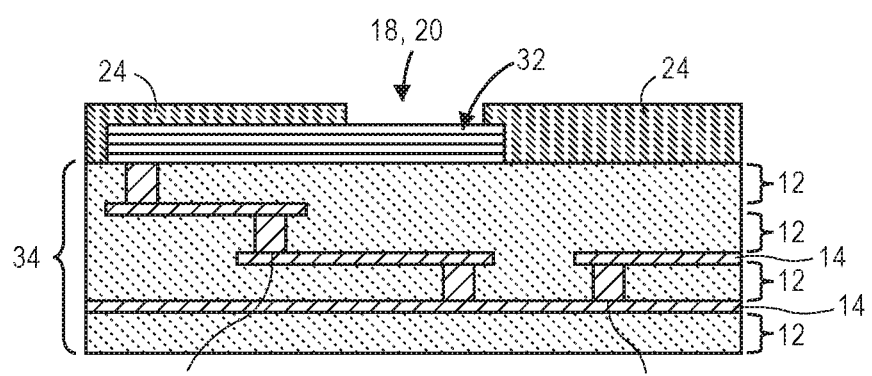
FIG. 3 is a cross sectional view of the LTCC substrate cut along the line 3-3 of FIG. 2, illustrating a plurality of layers of a dielectric, a plurality of layers of an inner conductor, and an outer conductor including a stack of thin film metal layers.

A low temperature cofired ceramic (LTCC) substrate 10, constructed in accordance with various embodiments of the current invention, is shown in FIGS. 1-3. The LTCC substrate 10 may broadly comprise a plurality of dielectric layers 12, at least one inner conductor layer 14, a plurality of vias 16, an outer conductor 18, a plurality of wire bond pads 20, a plurality of solder bond pads 22, and a solder mask 24. The LTCC substrate 10 may be utilized to form an electronic module 24, as shown in FIG. 4. The electronic module 24 may also include integrated circuit (IC) dies 28 and electronic devices 30 or components, which may be attached through wire bonding or solder bonding to an upper surface of the LTCC substrate 10. The LTCC substrate 10 may be further configured to attach to devices, such as IC dies 28, or other substrates, such as printed circuit (PC) boards, through flip-chip bonding (not shown in the figures).

Each dielectric layer 12, best seen in FIG. 3, generally provides electric insulation, isolation, or dielectric functions and may be formed from a sheet of ceramic-based ($Al_2O_3$) material, particularly ceramic or ceramic and glass material. The ceramic material may be supplied in the form of ceramic powders, but much more widely used are green sheets or tape from manufacturers such as DuPont of Wilmington, Del. Typically, each dielectric layer 12 is a sheet of material cut to have a square or rectangular shape, although other shapes are possible, with a thickness ranging from 50 micrometers (μm) to 250 μm.

Each inner conductor layer 14, best seen in FIG. 3, generally provides electrical power and/or signal connection for the electronic circuitry of the IC dies 28 and electronic devices 30. Each inner conductor layer 14 may also provide passive electronic components. The electrical power and/or signal connection may include electrically conductive traces and/or planes and the passive electronic components may include resistors, capacitors, and inductors. The inner conductor layer 14 may be formed from electrically conductive silver (Ag) thick film paste or gold (Au) thick film paste, referred to as metal paste.

Each via 16, best seen in FIG. 3, generally provides electrical connection from one inner conductor layer 14 to one or more other inner conductor layers 14 or to an upper surface and/or lower surface of the LTCC substrate 10. Each via 16 may be formed from one of the metal pastes and may be positioned in an opening in one of the dielectric layers 12.

The outer conductor 18 generally provides electrical connection and bond pads 20, 22 on the upper surface of the LTCC substrate 10, as shown in FIGS. 1-4. The outer conductor 18 may also provide electrical connection and bond pads 20, 22 on the lower surface of the LTCC substrate 10 (not shown in the figures). The outer conductor 18 may be formed from a plurality of thin film metal conductive sublayers 32. Each conductive sublayer 32 may be formed from a different metal, typically providing a specific function or benefit. For example, one metal, such as platinum, may provide robust solder connectivity. Another metal, such as copper, may provide good radio frequency (RF) connectivity or performance. Yet another metal, such as titanium, may provide good adhesion to the dielectric layer 12 as well as providing a barrier to metal diffusion. Still another metal, such as gold, may provide good wire bonding connectivity.

It is possible that the outer conductor 18 may include metal paste that is printed in a pattern to form electrical interconnects and possibly passive electronic components, but not bond pads 20, 22. Or, the LTCC substrate 10 may include a second outer conductor comprising metal paste that is printed in a pattern to form electrical interconnects and possibly passive electronic components, but not bond pads 20, 22.

The wire bond pads 20 and the solder bond pads 22, as shown in FIGS. 1-3, generally provide electrical connectivity to external components or devices such as IC dies 28 and/or electronic devices 30. Each bond pad 20, 22 is formed from the outer conductor 18. The wire bond pads 20 may include the same conductive sublayers 32 as the solder bond pads 22. Or, the wire bond pads 20 may include conductive sublayers 32 with better wire bonding characteristics, while the solder bond pads 22 may include conductive sublayers 32 with better solder bonding characteristics. The wire bond pads 20 may receive, or connect to, bonding wires which also connect to wire bond pads on IC dies 28. The solder bond pads 22 may receive solder which also connects to solder pads of surface mount electronic devices 30. The solder bond pads 22 may also be substantially the same as flip-chip bond pads which connect to flip-chip bond pads on IC dies 28 such as ball-grid array (BGA) packages.

The solder mask 24, best seen in FIGS. 2 and 3, generally provides exposure to the outer conductor 18 where an electrical connection is to be made. The solder mask 24 may also provide cover for those areas of the upper and/or lower surface of the LTCC substrate 10 where no electrical connection is made. For example, the solder mask 24 may include a plurality of openings, one opening for each of the bond pads 20, 22 to which an electrical connection is made. The opening may be sized to allow solder to flow on the bond pad 20, 22 or for a bond wire to be attached. Otherwise, the solder mask 24 may cover the top or bottom dielectric layer 12 and the outer conductor 18 where electrical interconnect traces are formed. The solder mask 24 may include an oxide, such as silicon dioxide, a nitride, such as silicon nitride, or combinations of both.

FIG. 5 depicts a listing of at least a portion of the steps of an exemplary method 100 for fabricating an LTCC substrate 10. The steps may be performed in the order shown in FIG. 5, or they may be performed in a different order. Furthermore, some steps may be performed concurrently as opposed to sequentially. In addition, some steps may be optional or may not be performed.

Referring to step 101, a stack 34 of dielectric material layers 12 and at least one inner electrically conductive material layer 14 is fired. Each dielectric layer 12 may be formed from ceramic-based ($Al_2O_3$) material. Each inner conductor layer 14 may be formed from electrically conductive silver (Ag) thick film paste or gold (Au) thick film paste, referred to as metal paste.

The stack 34, as shown in FIG. 3, may be formed with the following general process or substeps. Each dielectric layer 12 is formed by cutting ceramic material into a thin rectangular or square sheet with an upper surface and a lower surface. Holes are formed from the upper surface to the lower surface on each dielectric layer 12, with each hole receiving a layer-to-layer via 16. The holes may be formed by punching or drilling or the like. The via 16 is formed by filling in the hole with metal paste. Each inner conductor layer 14 is formed by printing the metal paste on the upper surface of one of the dielectric layers, such that the metal paste is printed in a pattern which creates electrical interconnect traces, passive electronic components, or both. The dielectric layers 12, each with its associated inner conductor layer 14, are stacked one upon another. The stack 34 is then laminated under pressure. Afterward, the stack 34 is fired at a temperature from 800° C. to 1000° C. In some embodiments, a layer of metal paste may be printed on one of the outer surfaces of the stack 34 to form electrical interconnects and possibly passive electronic components, but not bond pads 20, 22. The stack 34 may be fired again.

Referring to step 102, an outer electrical conductor 18 is deposited on the upper surface, the lower surface, or both surfaces of the stack 34. The outer conductor 18 may include a plurality of thin-film metal electrically conductive sublayers 32. Each conductive sublayer 32 may be formed from a different metal, such as platinum, titanium, gold, copper, and so forth. Typically, each sublayer 32 of metal is deposited one at a time to form a multilayer conductor on the upper surface and/or lower surface of the stack 34.

Referring to step 103, at least a portion of the outer conductor 18 is removed to form bond pads 20, 22 on the upper and/or lower surface. The portions of the outer conductor 18 may be removed by patterning and etching each conductive sublayer 32, as is generally known. In addition to the bond pads 20, 22, other features that may be formed on the upper and/or lower surface include electrical interconnect traces, passive electronic components, and the like.

Referring to step 104, a solder mask 24 is deposited on the upper and/or lower surface of the stack 34 using plasma enhanced chemical vapor deposition (PECVD). The stack 34 may be placed in a chamber. Heat may be applied to the stack 34 to raise its temperature ranging from approximately 250° C. to approximately 350° C. A source gas may be introduced in the chamber so that it can interact with the stack 34. The source gas may be chosen according to the composition of the solder mask 24 to be deposited. For example, tetraethylorthosilicate (TEOS) may be chosen in order to deposit silicon dioxide. Silane or ammonia may be chosen in order to deposit silicon nitride. Other source gases may be chosen in order to deposit other oxides or nitrides. A time-varying electric field with a frequency in the radio frequency (RF) range may be applied to the gas to ionize it and create a plasma. The ionized gas may react with the upper surface of the stack 34, depositing the solder mask 24 thereupon. The solder mask 24 may cover the outer conductor 18.

Referring to step 105, at least a portion of solder mask 24 is removed to expose the bond pads 20, 22, as shown in FIG. 2. Portions of the solder mask 24 may be removed by patterning and etching, as is generally known. In various embodiments, portions of the solder mask 24 are removed to expose only a portion of each bond pad 20, 22. For example, the solder mask 24 may overlap a portion of each bond pad 20, 22 inward from the perimeter of the bond pad 20, 22.

Using silicon dioxide or silicon nitride as the material for the solder mask 24 provides good performance in masking solder. Depositing the solder mask 24 using PECVD allows silicon dioxide or silicon nitride to be deposited at a much lower temperature than prior art approaches—which allows silicon dioxide or silicon nitride to be deposited on a stack of thin film metal layers without causing damage to the thin film metal.

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. A low temperature cofired ceramic (LTCC) substrate comprising:
   a plurality of dielectric layers formed from ceramic material, the dielectric layers placed one on top of another to form a stack;
   at least one inner conductor layer formed from electrically conductive paste, the at least one inner conductor layer positioned on an upper surface of at least one inner dielectric layer;
   a plurality of bond pads positioned on an outer surface of the stack, each bond pad formed from a plurality of conductive sublayers of thin film metal stacked one on top of another, each conductive sublayer formed from a different metal; and
   a solder mask positioned on the same outer surface of the stack as the bond pads, the solder mask overlapping at least a first portion of each of the bond pads, the solder mask including a plurality of openings, each opening exposing at least a second portion of one of the bond pads.

2. The LTCC substrate of claim 1, wherein the solder mask is formed from silicon nitride.

3. The LTCC substrate of claim 1, wherein the solder mask overlaps a portion of each bond pad.

4. The LTCC substrate of claim 1, wherein a first portion of the bond pads are wire bond pads and a second portion of the bond pads are solder bond pads.

5. A low temperature cofired ceramic (LTCC) substrate comprising:
   a plurality of dielectric layers formed from ceramic material, the dielectric layers placed one on top of another to form a stack;
   at least one inner conductor layer formed from electrically conductive paste, the at least one inner conductor layer positioned on an upper surface of at least one inner dielectric layer;
   a plurality of bond pads positioned on an outer surface of the stack, each bond pad formed from a plurality of conductive sublayers of thin film metal stacked one on top of another, each conductive sublayer formed from a different metal; and
   a solder mask formed from silicon dioxide and positioned on the same outer surface of the stack as the bond pads, the solder mask overlapping at least a first portion of each of the bond pads, the solder mask including a plurality of openings with each opening exposing at least a second portion of a successive one of the bond pads.

* * * * *